US008874837B2

(12) United States Patent
Neely et al.

(10) Patent No.: US 8,874,837 B2
(45) Date of Patent: Oct. 28, 2014

(54) EMBEDDED MEMORY AND DEDICATED PROCESSOR STRUCTURE WITHIN AN INTEGRATED CIRCUIT

(75) Inventors: Christopher E. Neely, San Jose, CA (US); Gordon J. Brebner, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 181 days.

(21) Appl. No.: 13/291,975

(22) Filed: Nov. 8, 2011

(65) Prior Publication Data

US 2013/0117504 A1 May 9, 2013

(51) Int. Cl.
*G06F 12/00* (2006.01)
*H03K 19/173* (2006.01)
*H03K 19/177* (2006.01)
*H04L 12/741* (2013.01)

(52) U.S. Cl.
CPC ...... *H03K 19/17732* (2013.01); *H03K 19/1733* (2013.01); *H01L 2924/1011* (2013.01); *H03K 19/17728* (2013.01); *H01L 2924/14* (2013.01); *H04L 45/74* (2013.01)
USPC ........... 711/104; 711/103; 711/109; 711/114; 711/157; 712/10; 712/42; 712/227; 714/48; 714/731; 714/763

(58) Field of Classification Search
USPC ........................................................ 711/104
See application file for complete search history.

(56) References Cited

U.S. PATENT DOCUMENTS

| | | | | |
|---|---|---|---|---|
| 4,379,284 A * | 4/1983 | Boykin | ........................ | 375/329 |
| 4,535,454 A * | 8/1985 | Buzzard et al. | ............... | 370/525 |
| 5,206,851 A * | 4/1993 | Cho | ............................. | 369/47.2 |
| 5,469,003 A * | 11/1995 | Kean | ............................... | 326/39 |
| 5,500,609 A * | 3/1996 | Kean | ............................... | 326/41 |
| 5,600,815 A * | 2/1997 | Lin et al. | ....................... | 711/109 |
| 5,605,782 A * | 2/1997 | Put et al. | ....................... | 430/321 |
| 5,629,637 A * | 5/1997 | Trimberger et al. | ............ | 326/93 |
| 5,646,545 A * | 7/1997 | Trimberger et al. | ............ | 326/38 |
| 6,125,404 A * | 9/2000 | Vaglica et al. | ................ | 713/375 |
| 6,807,125 B2 * | 10/2004 | Coteus et al. | ............... | 365/233.1 |
| RE38,955 E * | 1/2006 | Shirley et al. | ................ | 365/190 |
| 7,000,139 B2 * | 2/2006 | Araki | ............................ | 713/600 |
| 7,171,529 B2 * | 1/2007 | Ajiro | ............................ | 711/157 |
| 7,308,564 B1 * | 12/2007 | Jenkins, IV | ................... | 712/227 |
| 7,412,586 B1 * | 8/2008 | Rajopadhye et al. | ........... | 712/10 |

(Continued)

OTHER PUBLICATIONS

Scalable High-Throughput SRAM-Based Architecture for IP-Lookup Using FPGA, Le at al, International Conference on Field Programmable Logic and Applications, 2008. FPL 2008, Sep. 8, 2008-Sep. 10, 2008, pp. 137-142 (6 pages).*

(Continued)

*Primary Examiner* — Sanjiv Shah
*Assistant Examiner* — Daniel C Chappell
(74) *Attorney, Agent, or Firm* — Kevin T. Cuenot

(57) ABSTRACT

An integrated circuit can include a programmable circuitry operable according to a first clock frequency and a block random access memory. The block random access memory can include a random access memory (RAM) element having at least one data port and a memory processor coupled to the data port of the RAM element and to the programmable circuitry. The memory processor can be operable according to a second clock frequency that is higher than the first clock frequency. Further, the memory processor can be hardwired and dedicated to perform operations in the RAM element of the block random access memory.

18 Claims, 11 Drawing Sheets

(56) References Cited

U.S. PATENT DOCUMENTS

| | | | | |
|---|---|---|---|---|
| 7,546,410 | B2* | 6/2009 | Bartley et al. | 711/104 |
| 7,664,931 | B2* | 2/2010 | Erforth et al. | 712/42 |
| 7,797,610 | B1* | 9/2010 | Simkins | 714/763 |
| 7,814,218 | B1* | 10/2010 | Knee et al. | 709/230 |
| 7,823,117 | B1* | 10/2010 | Bennett | 703/13 |
| 7,949,793 | B1* | 5/2011 | James-Roxby et al. | 710/5 |
| 8,112,574 | B2* | 2/2012 | Lee et al. | 711/103 |
| 8,151,278 | B1* | 4/2012 | Knee et al. | 719/318 |
| 8,301,833 | B1* | 10/2012 | Chen et al. | 711/104 |
| 8,327,194 | B1* | 12/2012 | Sabih | 714/45 |
| 8,327,200 | B1* | 12/2012 | Mohan | 714/725 |
| 8,627,003 | B2* | 1/2014 | Cromer et al. | 711/114 |
| 8,683,149 | B2* | 3/2014 | Ware et al. | 711/157 |
| 2003/0053460 | A1* | 3/2003 | Suda et al. | 370/392 |
| 2006/0081971 | A1* | 4/2006 | Shau | 257/690 |
| 2006/0092944 | A1* | 5/2006 | Wingard et al. | 370/395.2 |
| 2006/0236180 | A1* | 10/2006 | Ong | 714/731 |
| 2010/0158023 | A1* | 6/2010 | Mukhopadhyay et al. | 370/401 |
| 2012/0011351 | A1* | 1/2012 | Mundra et al. | 713/1 |

OTHER PUBLICATIONS

A Memory-Balanced Linear Pipeline Architecture for Trie-based IP Lookup, Jiang et al, 15th Annual IEEE Symposium on High-Performance Interconnects, 2007. HOTI 2007., Aug. 22, 2007-Aug. 24, 2007, pp. 83-90 (8 pages).*

Xilinx Logicore Content-Addressable Memory v6.1, Xilinx, Sep. 19, 2008, retrieved from http://www.xilinx.com/support/documentation/ip_documentation/cam_ds253.pdf retrieved May 14, 2013 (18 pages).*

CIDR (Classless InterDomain Routing), Orbit-Computer-Solutions. Com, retrieved from http://web.archive.org/web/20090611073829/http://www.orbit-computer-solutions.com/CIDR.php on May 14, 2013 (3 pages).*

An Overview of Multiple CAM Designs in Virtex Family Devices (Version 1.1), Xilinx, Sep. 23, 1999 (6 pages).*

ASIC Verification: Clock Dividers, ASIC Verification, retrieved from http://chipverification.blogspot.com/2008/05/clock-dividers.html on Sep. 26, 2013 (3 pages).*

Clock divider definition, Yahoo! Answers, retrieved from http://answers.yahoo.com/question/index?qid=20111128143844AAGarGs on Sep. 26, 2013 (1 page).*

FPGA Fundamentals, National Instruments, May 3, 2012, retrieved from http://www.ni.com/white-paper/6983/en/ on Sep. 26, 2013 (4 pages).*

Virtex-4 Family Overview, Xilinx, Aug. 30, 2010, retrieved from http://www.xilinx.com/support/documentation/data_sheets/ds112.pdf on Sep. 26, 2013 (9 pages).*

Virtex-4 FPGA User Guide, Xilinx, Dec. 1, 2008, retrieved from http://www.xilinx.com/support/documentation/user_guides/ug070.pdf on Sep. 26, 2013 (406 pages).*

Virtex-5 Family Overview, Xilinx, Feb. 6, 2009, retrieved from http://www.xilinx.com/support/documentation/data_sheets/ds100.pdf on Sep. 26, 2013 (13 pages).*

IP core (intellectual property core), WhatIs.com, Mar. 2011, retrieved from http://whatis.techtarget.com/definition/IP-core-intellectual-property-core on Sep. 26, 2013.*

Embedded Processor Block in Virtex-5 FPGAs, Xilinx, Feb. 24, 2010, retrieved from http://www.xilinx.com/support/documentation/user_guides/ug200.pdf on Jun. 9, 2014 (347 pages).*

Le, H., et al., "Scalable High-Throughput SRAM-Based Architecture for IP-Lookup Using FPGA," Int'l Conf. on Field Programmable Logic and Applications (FPL 2008), Sep. 8-10, 2008, pp. 137-142.

Jiang, W., et al., "A Memory-Balanced Linear Pipeline Architecture for Trie-based IP Lookup," 15th IEEE Symposium on High-Performance Interconnects (HOTI 2007), Aug. 22-24, 2007, 8 pgs.

Xilinx, Inc., "An Ove3rview of Multiple CAM Designs in Virtex Family Devices", Application Note, XAPP 201, Sep. 23, 1999 (Version 1.1), 2100 Logic Drive, San Jose, CA 95124.

* cited by examiner

US 8,874,837 B2

EMBEDDED MEMORY AND DEDICATED PROCESSOR STRUCTURE WITHIN AN INTEGRATED CIRCUIT

FIELD OF THE INVENTION

One or more embodiments disclosed within this specification relate to integrated circuits (ICs). More particularly, one or more embodiments relate to an embedded memory and dedicated processor structure within an IC.

BACKGROUND

Within high-speed network applications, the ability to perform lookup operations quickly can be of critical importance. In order to process a packet, for example, one or more attributes of the packet typically must be determined and used to perform a lookup operation. The result of the lookup operation can be determinative of the handling to be implemented for the packet. A non-exhaustive list of attribute examples that can influence packet handling can include packet type, packet ownership, and the like. Examples of packet handling operations can include, but are not limited to, determining the next hop address for a packet based upon the destination address of the packet, forwarding a packet, routing packets, and screening packets. These sorts of packet operations can involve one or more lookup operations per packet.

Accordingly, the bandwidth of a network node can be highly dependent upon the ability of the network node to perform lookup operations quickly and efficiently. Slow lookup performance can result in reduced bandwidth in the network node. Slow lookup performance also can increase the cost of the network node since latency induced by the lookup process may necessitate the inclusion of additional memory in the network node to avoid data overflow conditions.

SUMMARY

One or more embodiments disclosed within this specification relate to integrated circuits (ICs) and, more particularly, to an embedded memory and dedicated processor structure within an IC.

An embodiment can include an IC. The IC can include a programmable circuitry operable according to a first clock frequency and a block random access memory. The block random access memory can include a random access memory (RAM) element having at least one data port and a memory processor coupled to the data port of the RAM element and to the programmable circuitry. The memory processor can be operable according to a second clock frequency that is higher than the first clock frequency. Further, the memory processor can be hardwired and dedicated to perform operations in the RAM element of the block random access memory.

Another embodiment can include an IC. The IC can include a programmable circuitry and a multi-stage pipeline circuit structure. The multi-stage pipeline circuit structure can include a plurality of block random access memories. Each block random access memory can include a RAM element having at least one data port and a dedicated memory processor coupled to the data port. Each memory processor of the plurality of block random access memories can be coupled to at least one other memory processor of another block random access memory of the plurality of block random access memories through a hardwired signal path. At least one memory processor of the plurality of block random access memories can be coupled to the programmable circuitry and can be configured to receive at least a portion of a search key.

Another embodiment can include an IC. The IC can include a programmable circuitry operable according to a first clock frequency and a block random access memory including a RAM element having a first data port and a second data port. The first data port can be coupled to the programmable circuitry. The memory processor can be coupled to the second data port and to the programmable circuitry. The memory processor can be operable according to a second clock frequency that is higher than the first clock frequency. The memory processor can be hardwired and dedicated to perform operations in the RAM element.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to an embedded memory and dedicated processor structure within an IC. In accordance with one or more embodiments disclosed within this specification, lookup performance can be increased through the inclusion of a processing element with an embedded memory. Within an IC having embedded memory blocks, a processing element can be included for one or more of the embedded memory blocks. Signal paths between adjacent ones of the processing elements can be hardened to increase the bandwidth of the circuitry when arranged in a pipelined configuration. In one aspect, the processing elements included with the memory blocks can be dedicated to performing search or lookup operations within the particular memory block to which each processing element is associated.

Figure 1:
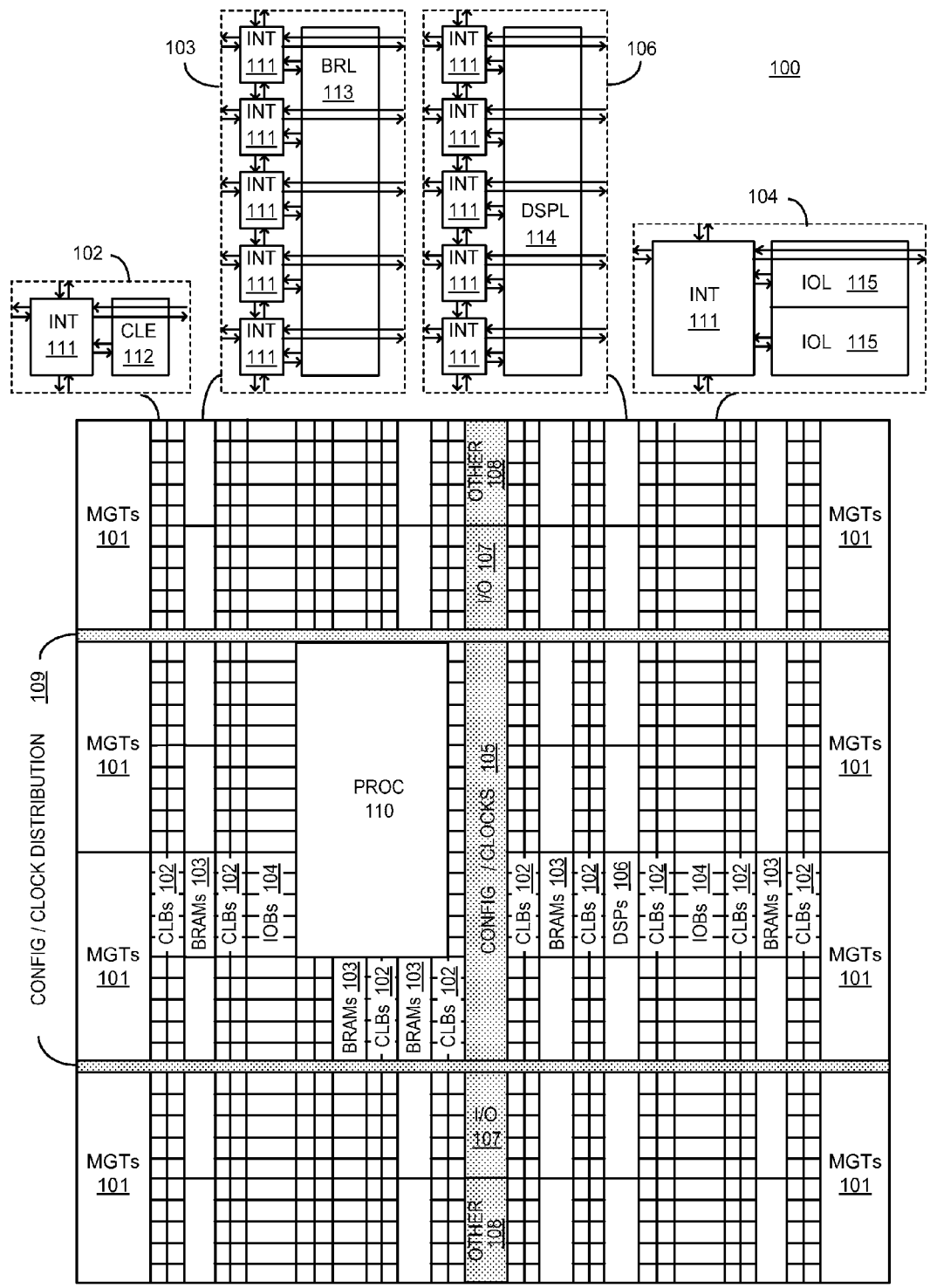
FIG. 1 is a first block diagram illustrating an architecture for an integrated circuit (IC) in accordance with an embodiment disclosed within this specification.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

PROC 110 can be implemented as a hardwired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set or sets of configuration bits can be used to program programmable circuitry of an IC such as an FPGA. The configuration data or bit(s) typically are referred to as a "configuration bitstream." In general, programmable circuitry is not operational or functional without first loading a configuration bitstream into the IC. The configuration bitstream effectively specifies a circuit design. Loading the configuration bitstream into the IC implements or instantiates the particular circuit design specified by the bitstream within the programmable circuitry. The circuit design specifies, for example, functional aspects of the programmable circuit blocks and connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function as manufactured as part of the IC.

FIG. 1 is intended to illustrate an exemplary architecture that can be used to implement an IC that includes programmable circuitry, e.g., a programmable fabric, and a processor system. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of PROC 110 within the IC is for purposes of illustration only and is not intended as a limitation of the one or more embodiments disclosed within this specification.

The one or more embodiments disclosed within this specification can be implemented within an IC, whether programmable or not. Programmable ICs are a well-known type of integrated circuit that can be programmed to perform specified logic functions. In general, a programmable IC can be any IC, including an application specific IC, that includes at least some programmable circuitry. Examples of programmable ICs can include, but are not limited to, FPGAs, complex programmable logic devices (CPLDs), and mask programmable devices. Accordingly, the phrase "programmable IC" refers to the ICs noted herein and ICs that are only partially programmable. For example, another type of programmable IC can include a combination of hard-coded transistor logic and a programmable switch fabric that programmably interconnects the hard-coded transistor logic.

Figure 2:
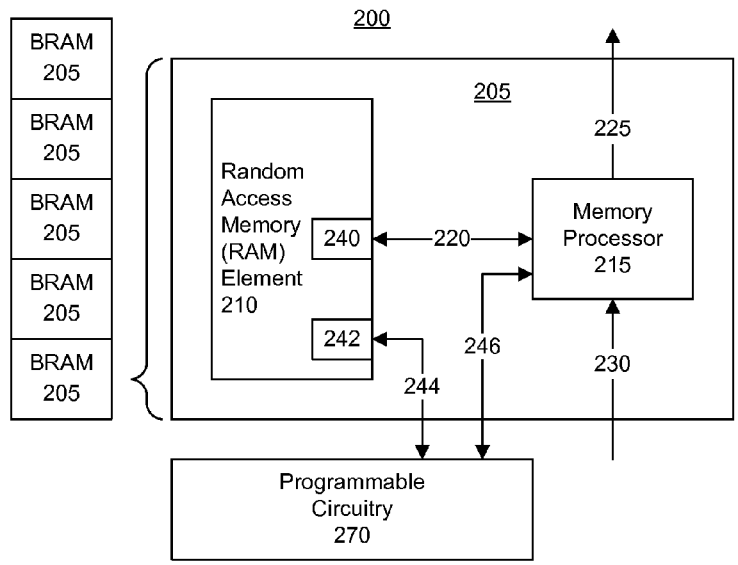
FIG. 2 is a block diagram illustrating an architecture for a block random access memory (BRAM) in accordance with another embodiment disclosed within this specification.

FIG. 2 is a block diagram illustrating an architecture for a BRAM 205 in accordance with another embodiment disclosed within this specification. FIG. 2 illustrates a column 200 including a plurality of BRAMs 205. Column 200, for example, can be implemented within an IC having an architecture as illustrated with reference to FIG. 1. For instance, BRAMs 205 can be used in lieu of, or in combination with, BRAMs 103 as described with reference to FIG. 1.

As shown, each BRAM 205 can include a random access memory (RAM) element 210 and a memory processor 215. In one aspect, RAM element 210 can be implemented substantially similar to, or the same as, a BRAM logic element (BRL) 113 described with reference to FIG. 1. In general, RAM element 210 can include one or more ports 240 that can be coupled to memory processor 215 via signal 220. Memory processor 215 can be coupled to other memory processors of neighboring BRAMs 205 via signals 225 and 230 in serial. RAM element 210 can be hardwired to memory processor 215 through port 240 and signal 220.

As shown, BRAM 205 can be coupled to programmable circuitry 270. Programmable circuitry 270 can be implemented using one or more programmable tiles or blocks and programmable interconnect circuitry as described generally with reference to FIG. 1. In one aspect, RAM element 210 can include one or more additional ports 242 that can couple to programmable circuitry 270 of the IC through signal 244. Ports 242, for example, can bypass memory processor 215.

While ports 240 can operate at the same clock frequency as memory processor 215, ports 242 can operate at the same clock frequency as programmable circuitry 270 of the IC. Different ones of the data ports can be enabled, e.g., rendered operable or inoperable, according to the configuration bitstream loaded into the IC. For example, based upon the configuration bitstream loaded into the IC, either ports 240 or ports 242 will be operable at any given time. As shown, programmable circuitry 270 further can be coupled to memory processor 215 via signal 246.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

In one aspect, memory processor 215 can be implemented as a hardwired circuit block. Further, signals 220, 225, and 230 can be hardwired signal paths. By implementing memory processor 215 and signals 220, 225, and 230 in the form of hardwired circuitry, BRAMs 205 can communicate among one another serially more effectively and at faster clock speeds than would be the case using programmable circuitry 270 (e.g., including programmable circuit blocks and programmable interconnects) to couple two or more BRAMs 205 together. Accordingly, in one embodiment, BRAMs 205 of column 200 can be coupled together forming a multi-stage pipeline in which data can be propagated from one BRAM 205 to the next within the column serially through memory processors 215 and signals 225 and 230 without utilizing programmable circuitry 270.

In general, BRAM 205 can be configured to operate at either the frequency of programmable circuitry 270 or the frequency of memory processor 215. For example, RAM element 210, including port 240, can be configured to operate at the clock frequency of memory processor 215, which is faster than the frequency used to operate programmable circuitry 270. RAM element 210, including port 242, further can be configured to operate the frequency of memory processor 215. The frequency of memory processor 215, for example, can be a multiple higher or faster than the frequency of programmable circuitry 270.

Each memory processor 215 of a BRAM 205 can be dedicated for use solely with RAM element 210 of that BRAM 205. As such, in one aspect, memory processor 215 can be configured to perform various data driven functions relating to RAM element 210. For example, memory processor 215 can be configured to perform search and/or lookup functions in RAM element 210.

In another example, memory processor 215 can be configured to detect particular conditions and, responsive to those conditions or a signal, update, e.g., increment or decrement, values within one or more memory locations within RAM element 210 that have been designated as counter locations. Regarding the counter functionality, memory processor 215 can encapsulate the implementation of one or more counters. The one or more trigger conditions can be generated by circuitry elsewhere within a system, e.g., within programmable circuitry 270, which is outside of BRAM 205. Responsive to a signal from such circuitry indicating that a particular condition has occurred, memory processor 215 can increment or decrement one or more different memory locations within RAM element 210.

In this manner, memory processor 215 can be configured to manipulate the internal state of one or more cells of RAM element 210. The one or more cells or memory locations that can be altered, for example, can be counters. Memory processor 215 can be considered tightly coupled or integrated with RAM element 210. Memory processor 215 can provide a layer of abstraction around the memory, thereby encapsulating the specialized behavior described.

The functionality of memory processor 215 also illustrates operation of a closed system that can be contrasted with the behavior or operation of a general purpose processor in which the coupling between the processor and the memory is less restricted, e.g., is loose. Other controllers that interact with memory, e.g., a memory controller, service basic read and write requests. A memory controller, for example, effectively schedules the fetching of data stored in a memory and either transfers requested data from the memory to a host or from the host to the memory, without modifying the data en route.

As noted, BRAMs 205 also can be configured to perform lookup operations. BRAMs 205 can be configured to perform lookup operations upon data that is organized in any of a variety of different formats. For example, data can be formatted and stored across two or more BRAMs 205 in the form of a Binary Search Tree (BST). In another example, data can be formatted and stored across two or more BRAMs 205 in the form of a trie.

A BST refers to a node-based binary tree data structure. A BST may also be referred to as an ordered or sorted binary tree. The hierarchical structure of the BST facilitates more efficient searching that attempts to minimize the number of comparisons that must be performed. In general, a BST is constructed of nodes. Each node represents a table entry. In the case of Longest Prefix Match (LPM), each node also stores a length of the entry.

LPM, also referred to as maximum prefix length match, refers to an algorithm used by routers in Internet Protocol (IP) networking to select an entry from a routing table. Each entry in a routing table may specify a network. Accordingly, one destination address can match more than one routing table entry. The most specific table entry can be referred to as the LPM because the table entry has the largest number of leading address bits that match the address bits of the destination address.

For example, prefixes can be used to compact routing tables. IP addresses are hierarchical in nature. Accordingly, rather than storing many flat address entries, a single prefix can be used to represent a range of IP addresses. Since two prefixes may overlap in that one prefix can represent a larger set of addresses and the other prefix can represent a smaller set of addresses, selection of the most specific prefix is desirable. The most specific prefix represents the smallest set of addresses. In this example, the longest matching prefix is the most specific or descriptive prefix and represents the smallest set of IP addresses.

Referring again to BSTs, each node can function as a parent. Each parent node can have two children. In a visual representation of a BST, the left child node is to the left of the parent node and the second child is to the right of the parent node. The left child and each descendant of the left child node must contain a value that is less than the value stored in the current node, e.g., the parent node. Similarly, the right child and each descendent of the right child node must contain a value that is greater than the value stored in the current node. Both the left and right subtrees that extend from the left and right child nodes respectively must also be BSTs. In order to perform efficient lookup, the tree should remain balanced.

While each node represents a data element, for sequencing and lookup purposes, nodes are generally compared according to the key of each node rather than using any part of records associated with the nodes. Operations on a BST require comparisons between nodes. These comparisons can be performed by memory processor 215 within one or more different BRAMs 205.

A trie refers to an ordered tree data structure that is used to store an associative array where the keys are usually strings. A trie also can be referred to as a prefix tree. Unlike a BST, no node in the trie stores the key associated with that node. Rather, the position of the node within the trie defines the key associated with that node. All the descendants of a node have a common prefix of the string associated with that node. The root is associated with the empty string. Values normally are not associated with every node, only with leaves and some inner nodes that correspond to keys of interest.

Like a BST, a trie can be used to facilitate LPM. A trie partitions bits stored therein to enable small bitwise comparisons at each level. The trie effectively stripes bits across levels. As such, the logical binary value represented by a path from the root node to a prefix node matches the value of the prefix. Each level has an associated stride, which specifies the number of bits to be examined at each level of the trie. Each node in a given level has $2^{stride}$ possible branches.

A lookup or search operation using a trie involves starting at the root of the trie and beginning with the most significant bit of the key. At each level, a branching decision/comparison is made in which each branch has an assigned binary value. The branching decision involves extracting the stride number of bits from the top of the prefix and following the branch having the same binary value. When a node following a branch contains a prefix, then the prefix matches the search key. The procedure can be repeated and continue toward the last trie level and least significant bit until the longest matching prefix is found. The comparisons necessary for searching trie formatted data can be performed by memory processor 215 within or one or more BRAMs 205.

Figure 3:
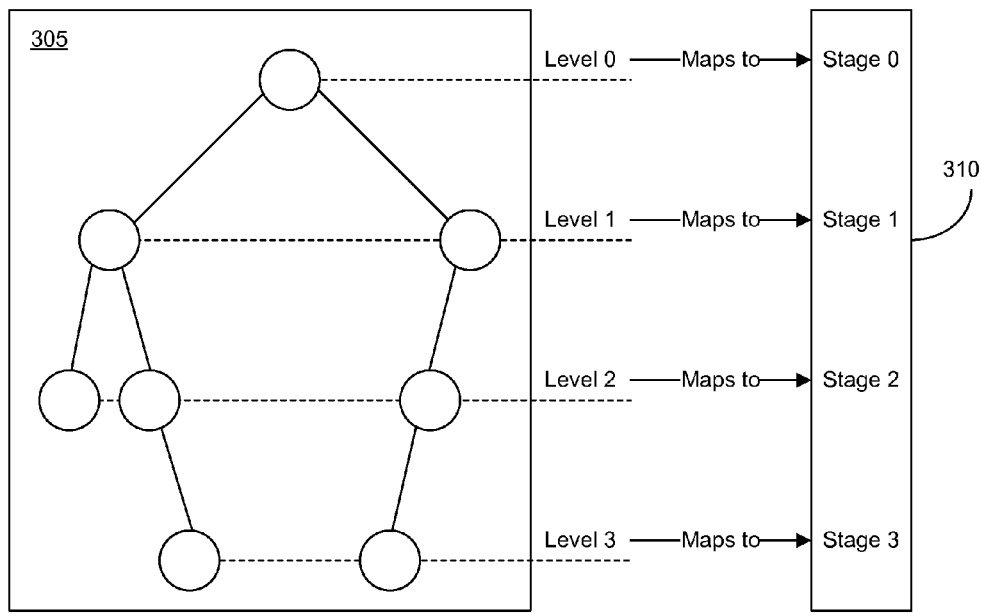
FIG. 3 is a diagram illustrating an exemplary mapping of a data structure to stages of a lookup system in accordance with another embodiment disclosed within this specification.

FIG. 3 is a diagram illustrating an exemplary mapping of a data structure 305 to stages of a lookup system 310 in accordance with another embodiment disclosed within this specification. In one aspect, data structure 305 can represent a BST. In another aspect, data structure 305 can represent a trie. In either case, FIG. 3 illustrates how data structure 305 can be segmented into levels indicated as levels 0, 1, 2, and 3.

Each level of data structure 305 can be mapped, or assigned to, a particular stage of lookup system 310 to be described in greater detail within this specification. In general, lookup system 310 can be implemented using BRAMs as described with reference to FIG. 2, e.g., a column of BRAMs. A plurality of BRAMs can be serially coupled together into a multi-stage pipelined structure. The plurality of BRAMs can be organized into groups of the BRAMs, where each group includes two or more individual BRAMs. Each group of BRAMs can implement a stage of lookup system 310, to which each level of data structure 305 is mapped.

It should be appreciated that data structure 305 is provided for purposes of illustration only. As such, an actual data structure that is stored across one or more BRAMs can include fewer or more nodes. Further, the data structure can have a same or different hierarchy as may be required.

Figure 4:
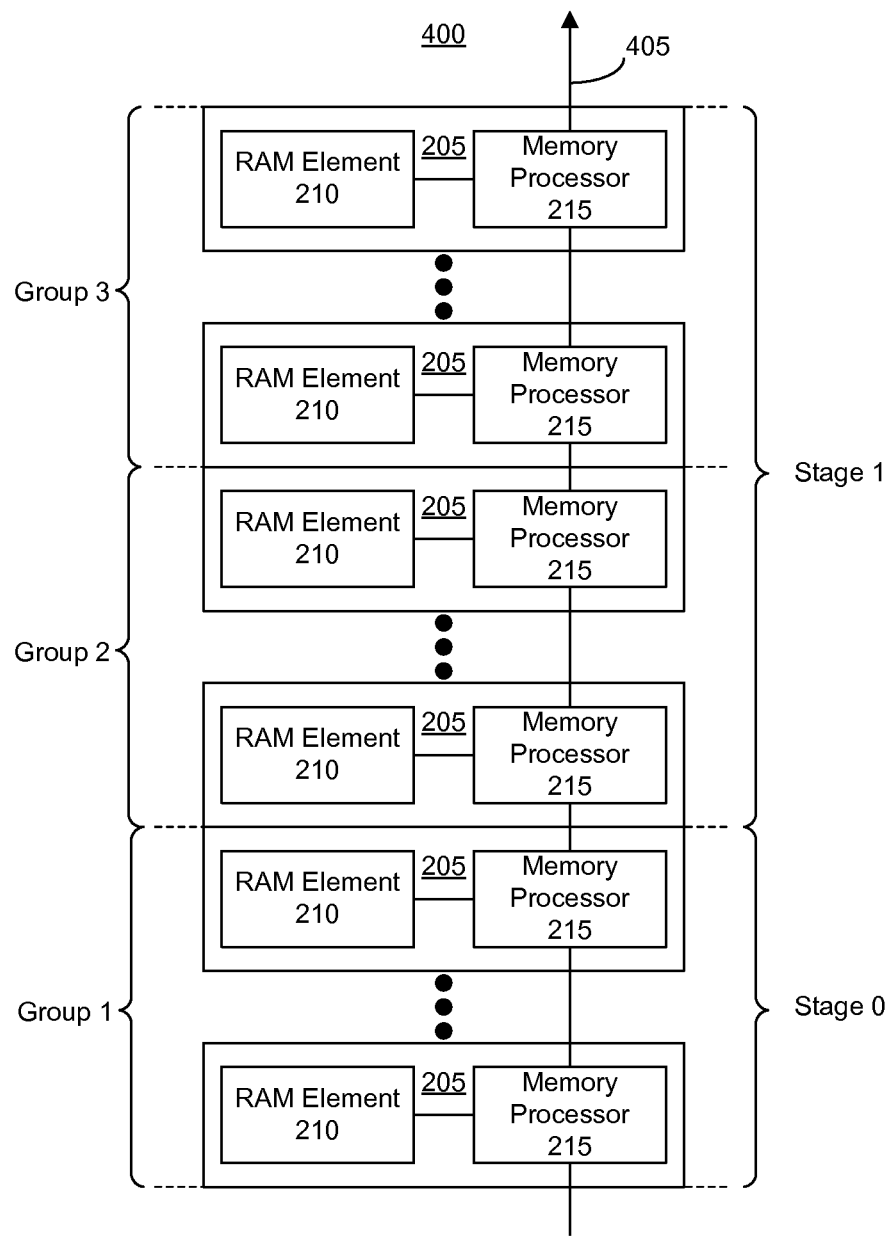
FIG. 4 is a block diagram illustrating a multi-stage pipelined structure using BRAMs in accordance with another embodiment disclosed within this specification.

FIG. 4 is a block diagram illustrating a multi-stage pipelined structure 400 using BRAMs in accordance with another embodiment disclosed within this specification. FIG. 4 illustrates that different ones of BRAMs 205 can be grouped into stages, where each stage can correspond to a level of a data structure of a BST or a trie as the case may be. For purposes of illustration, the example pictured in FIG. 4 relates to a BST implementation.

As shown, each BRAM 205 includes a RAM element 210 and a memory processor 215. Signal path 405 illustrates the data flow through memory processors 215 forming the hardwired pipelining of multi-stage pipelined structure 400. Multi-stage pipelined structure 400 can be implemented, e.g., mapped, onto a column of BRAMs 205 so long as a sufficient number of adjacent BRAMs 205 are allocated to meet the memory requirements of each stage. FIG. 4 illustrates two stages denoted as stage 0 and stage 1, with the pipeline flowing from bottom up, e.g., from stage 0 to stage 1. The example pictured in FIG. 4 shows the amount of memory doubling at each stage, which is characteristic of deeper levels of a BST implementation.

As briefly noted, a "group" can refer to "K" BRAMs 205, where "K" can be an integer value of one or more. Each stage can be formed one or more groups, where each group includes K BRAMs 205. Though each stage can include one or more groups of BRAMs 205, only one group of BRAMs 205 is active within each stage at any given time. For example, stage 0 includes a single group of BRAMs 205 labeled group 1. Since stage 0 includes only a single group, that group, i.e., group 1 is active. Stage 1, however, includes two groups denoted as group 2 and group 3. Within stage 1, either group 2 or group 3 is active at any given time. Inactive groups can implement pass-through behavior for signal path 405. As noted, for a BST implementation, the capacity of each stage can double presuming a same memory capacity for each of BRAMs 205 used.

In general, each memory processor 215 can be configured to perform functions such as storing table entries, storing lookup results, and comparing a selected entry against a search key, or portion thereof. As noted, memory processors 215 and signal path 405 can be hardwired.

In one aspect, interconnects between BRAMs 205 can be minimized. The size of "K," e.g., the number of BRAMs 205 in each group, can be determined according to the expression K=(32/W)+1, where "W" represents the width of each table entry. A group can store table entries in the top "K−1" BRAMs 205. Table results can be stored in the bottom BRAM 205. A search key and a lookup context can be passed through memory processors 215 as part of signal path 405. A "lookup context" can refer to, for example, a memory address, results, and/or status information. The top "K−1" BRAMs 205 can retrieve a stored entry from the address and compare the retrieved entry piecewise with the search key. The comparison can determine the context, e.g., a new address, for the next stage and the result. The context and result then can be passed to the next BRAM 205 in the pipeline.

Figure 5:
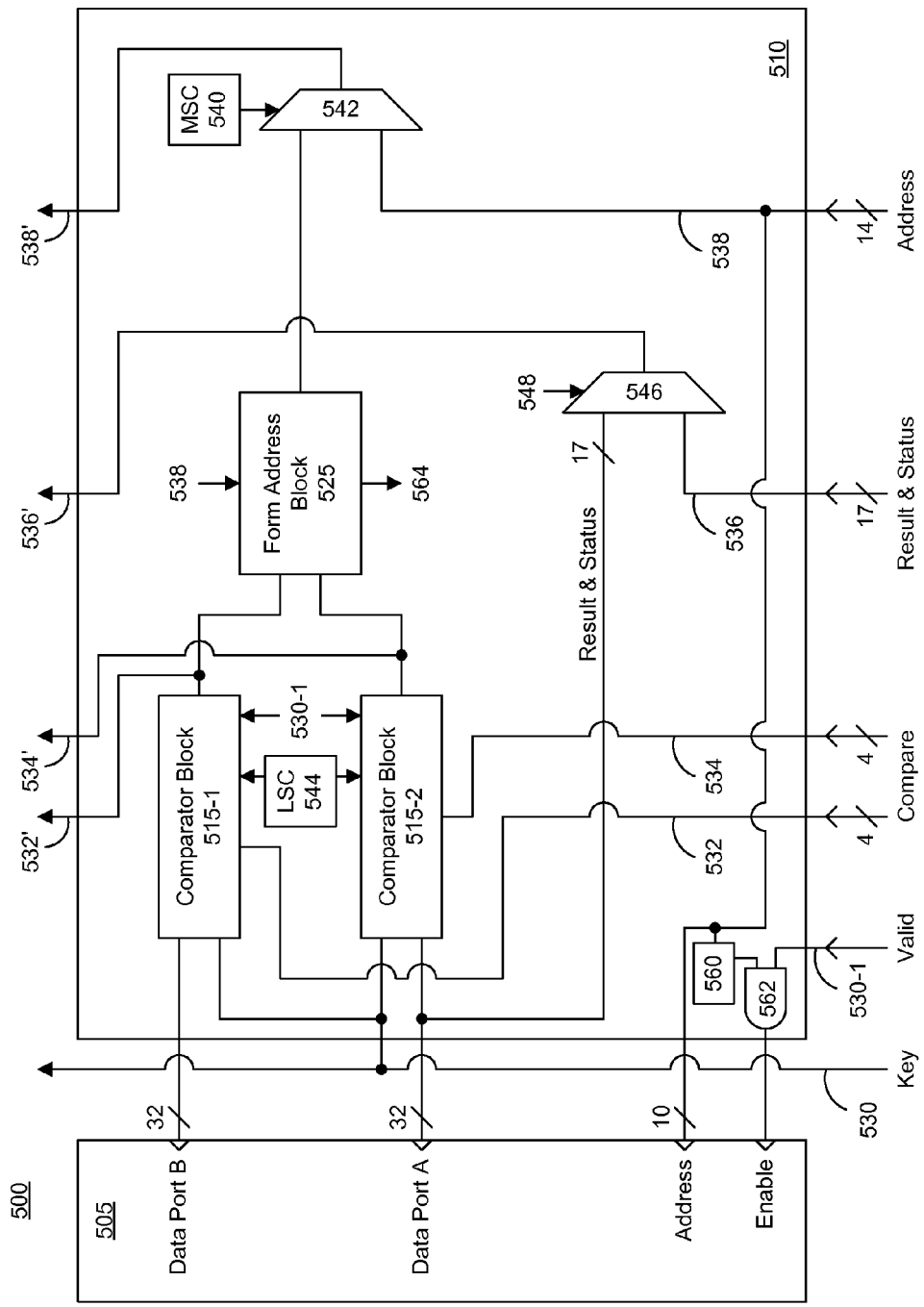
FIG. 5 is a block diagram illustrating a BRAM in accordance with another embodiment disclosed within this specification.

FIG. 5 is a block diagram illustrating a BRAM 500 in accordance with another embodiment disclosed within this specification. BRAM 500 is configured for implementation with a BST type of data structure for implementing LPM. In the example shown, BRAM 500 is configured to implement a range comparison. It should be appreciated that BRAM 500, as described, can implement one 32-bit portion of a comparison operation. As discussed, one or more BRAMs 500 can be pipelined together to form a plurality of stages in which each stage can perform a 32-bit portion of the comparison operation.

Content Addressable Memory (CAM) refers to memory that can be used when implementing an exact match strategy. In one aspect, a Binary CAM (BCAM) memory can be used. In another aspect, for more general matching, e.g., LPM, Ternary CAM (TCAM) can be used. The "ternary" portion of TCAM refers to using a 0, 1, or * (wild card) for each table bit position. FIG. 5 illustrates a TCAM implementation for an LPM type of lookup. A TCAM implementation can store a bit mask with each binary table entry, e.g., node. The bit mask can indicate which bits of the value must match during a lookup operation. Accordingly, two bits are stored per table entry data bit.

BRAM 500 can include a RAM element 505 and a memory processor 510. As shown, RAM element 505 can include two data ports denoted as data port A and data port B. Each of data ports A and B can be configured as 32-bit data ports. RAM element 505 further can include an address port that is configured for 10-bit operation and an enable port. As discussed, RAM element 505 can include one or more additional ports (not shown) that can couple directly to programmable circuitry. Ports that couple to programmable circuitry for BRAM 500 can be rendered inoperable when memory processor 510 is utilized.

The exemplary configuration illustrated in FIG. 5 makes use of the dual port nature of RAM element 505 for comparing the search word to a stored value for an upper bound and a lower bound. The comparison can be used to determine which direction to move down the BST in the form of an address for the next pipeline stage. Memory processor 510 can include comparator blocks 515-1 and 515-2 and a form address block 525.

A key can be passed along from one BRAM to the next via signal 530. As discussed, signal 530 can represent more than one data line or wire. Signal 530, like memory processor 510 and the various signals traversing therein, can be hardwired.

A lookup context can be passed along on additional signals denoted in FIG. 5 as signals 532, 534, 536, and 538. Signals 532 and 534 can be upper bound and lower bound compare signals respectively with each being 4-bits in width. Signal 536 can convey result and status information in the form of a 17-bit signal. Signal 538 can convey address information in the form of a 14-bit signal.

As shown, memory processor 510 can generate updated versions of each respective signal to be output to the next memory processor (not shown) within the pipelined architecture. For example, signals 532', 534', 536', and 538' can be generated and coupled to the next memory processor as inputs. Signal 530 can continue, for example, for the length of the column of BRAMs.

In operation, memory processor 510 can receive inputs in the form of a portion, e.g., a slice, of the key (signal 530), a previous comparison result and status (signal 536), the address from which to read and a next address that is passed through to a subsequent or next stage (signal 538). As noted, the slice of the key can be 32-bits. For purposes of illustration, RAM element 505 can be configured to store 1024 entries with each entry having a 36-bit width.

In this example, a valid signal 530-1 can be provided to RAM element 505 to enable RAM element 505 for reading and/or writing on selected clock cycles. In one aspect, valid signal 530-1 can be obtained from signal 530. For example, a register 560 that is configurable through the loading of a configuration bitstream can be included. Register 560 can match one or more address bits (as specified by the configuration bitstream), e.g., the top "M" bits, where M is an integer value, with the top M address bits from signal 538. The output of register 560 can be provided to an "AND" gate 562 along with signal 530-1. Thus, only when the top M bits of the address match and signal 530-1 indicates "valid" is RAM element 505 enabled on a particular clock cycle. When enabled, memory processor 510 can read from RAM element 505, perform any needed comparison(s), and modify the result and status corresponding to signal 536 and 536' as required.

As shown, signal 538 is provided to multiplexer 542. The control signal provided to multiplexer 542 can be from a most significant cell (MSC) 540. MSC 540 can be implemented as a register that can be configurable. For example, the value stored in MSC 540 can be loaded or specified through the loading of a configuration bitstream. MSC 540 specifies whether BRAM 500 corresponds to the most-significant bit (MSB) in a group of BRAMs, e.g., the most-significant bit in a particular stage. When set, BRAM 500 can update the address provided to the next BRAM or the next stage of the pipeline. For example, when MSC 540 is set, multiplexer 542 can pass the newly determined address generated or determined by form address block 525 as signal 538'. When MSC 540 is not set, the address received via signal 538 can be passed through and output as signal 538'.

A least significant cell (LSC) 544 also can be provided. Like MSC 540, LSC 544 can be a register that can be set through the loading of a configuration bitstream. When LSC 544 is set, the comparison output from each of comparator blocks 515-1 and 515-2 can be zeroed and propagated to the next memory processor in the pipeline through signals 532' and 534' respectively. When LSC 544 is not set, a piecewise comparison can be performed using comparator blocks 515-1 and 515-2.

In addition to receiving a signal from LSC 544, each of comparator blocks 515-1 and 515-2 can receive the valid signal, e.g., signal 530-1, to be operable on a given clock cycle. Comparator block 515-1 can perform an upper bound comparison while comparator block 515-2 can perform a lower bound comparison. As shown, FIG. 5 illustrates an example in which both data ports A and B of RAM element 505 are utilized to perform concurrent upper and lower bound comparisons to determine which direction to move within the BST as specified by the address generated by form address block 525.

In general, the piecewise comparison performed by comparator blocks 515-1 and 515-2 can be combined with the comparison results of the other BRAMs in the stage, e.g., as received via signals 532 and 534, and used to determine whether the key is less than or equal to the table entry value read from the address specified by signal 538 in RAM element 505.

In one aspect, the next address can be formed by form address block 525 by left shifting the current address as received via signal 538 by one and assigning the comparison result as the bottom address bit. Control signal 548 to multiplexer 546 can be a logical AND of signal 530-1 and signal 564. Signal 564 can be output from form address block 525 and indicate whether a match has been detected. Control signal 548 indicates whether to pass results and status information obtained from data port A of RAM element 505 as signal 536' or whether to propagate result and status information received from a prior BRAM, e.g., pass signal 536 as signal 536'. Responsive to determining that the key matches the table entry value, that the status is valid for the current clock cycle, e.g., both signal 530-1 and signal 564 are true rendering control signal 548 true, the result and status obtained from data port A can be output as signal 536' as the new result and status. Otherwise, the result and status received on signal 536 is output as signal 536'.

Figure 6:
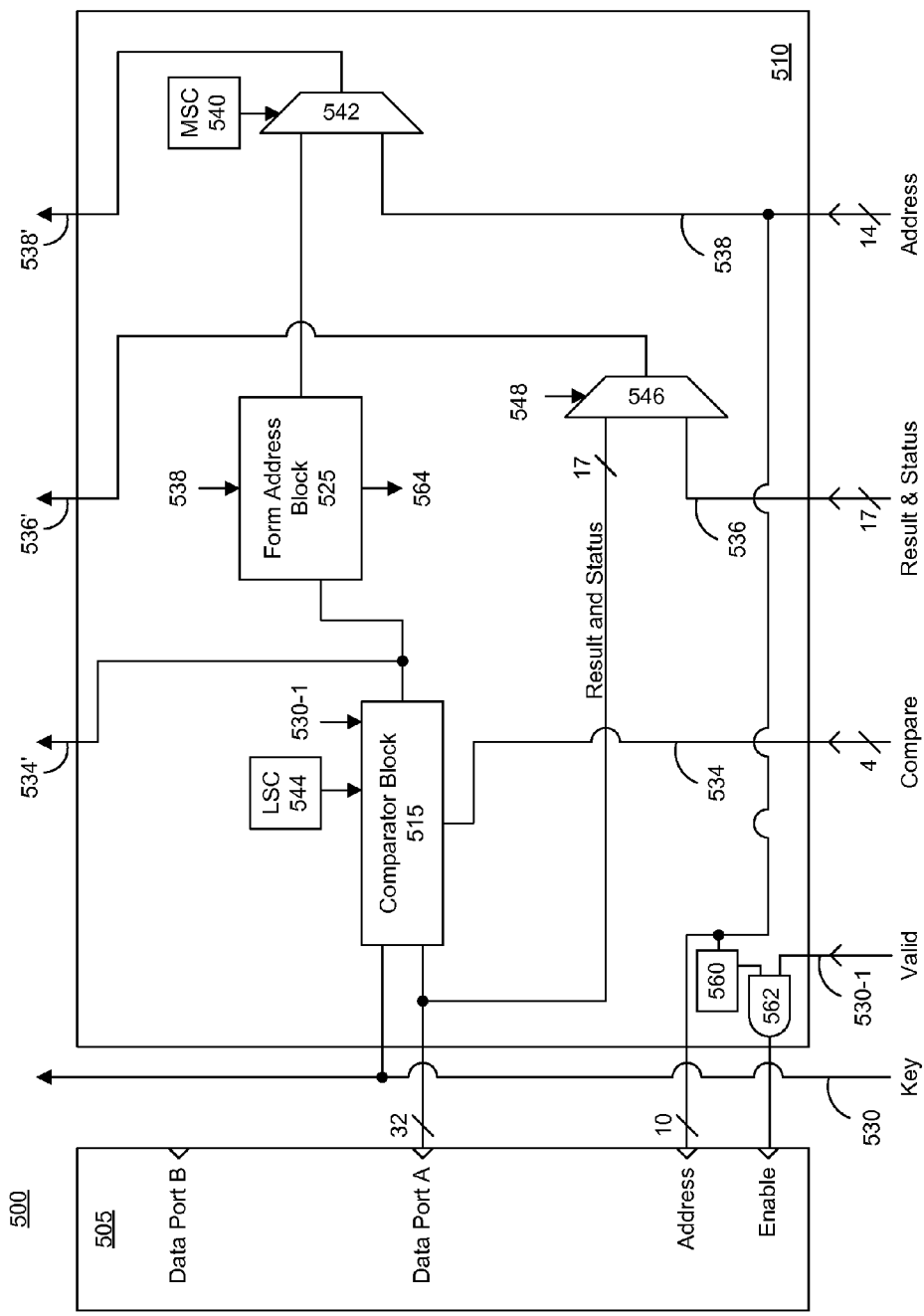
FIG. 6 is a block diagram illustrating the BRAM of FIG. 5 in accordance with another embodiment disclosed within this specification.

FIG. 6 is a block diagram illustrating BRAM 500 of FIG. 5 in accordance with another embodiment disclosed within this specification. In FIG. 6, BRAM 500 is configured for implementation with a BST type of data structure for implementing LPM. Whereas FIG. 5 illustrated an embodiment for use with TCAM type of memories, FIG. 6 illustrates an embodiment for use with BCAM type of memories. Accordingly, only a single comparator block 515 is utilized. Further, only a single data port, i.e., data port A, of RAM element 505 is accessed.

Since memory processor 510 is configurable to an extent, though implemented as a hardwired block, in one aspect, rather than removing comparator block 515-1 and signals 532, 532' and other internal connections from data port B to comparator block 515-1, from LSC 544 and signal 530-1 to comparator block 515-1, and from comparator block 515-1 to form address block 525, such components and/or connections can be disabled via the loading of a suitable configuration bitstream. In this regard, memory processor 510 of FIG. 5 and memory processor 510 of FIG. 6 need not be implemented as two different hardwired circuit blocks, but rather as one hardwired circuit block with a TCAM operating state and a BCAM operating state that can be selected through the implementation or loading of an appropriate configuration bitstream.

Figure 7:
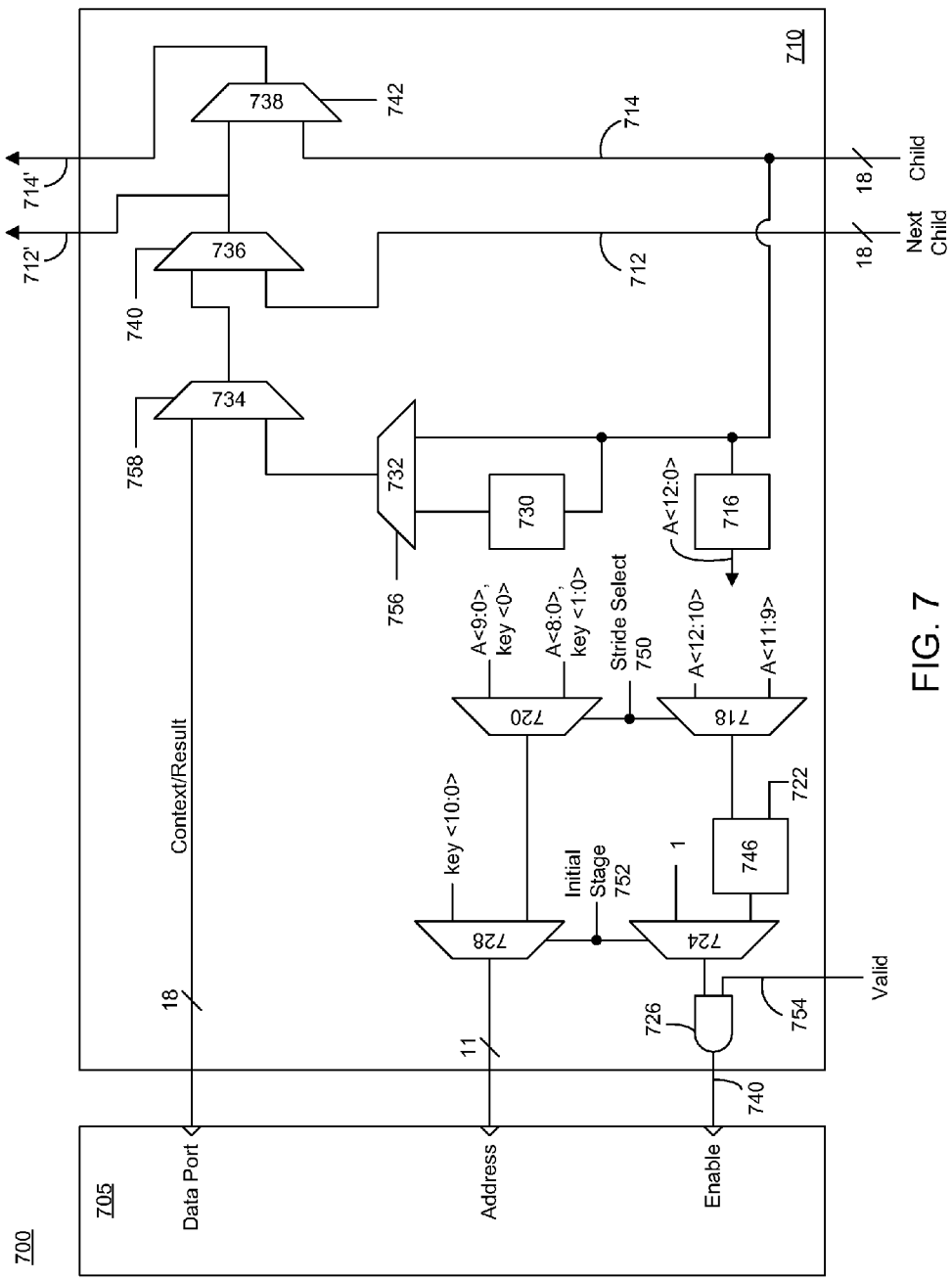
FIG. 7 is a block diagram illustrating a BRAM in accordance with another embodiment disclosed within this specification.

FIG. 7 is a block diagram illustrating a BRAM 700 in accordance with another embodiment disclosed within this specification. BRAM 700 is configured for implementation with a trie type of data structure for implementing LPM. As shown, BRAM 700 can include a RAM element 705 and a memory processor 710. For purposes of illustration, RAM element 705 can be configured for storing 2048 entries with each entry being 18-bits in width.

The inputs to memory processor 710 can include a slice, or portion, of the key. The key slice input to memory processor 710 can be provided as input to multiplexer 720 and is denoted as "key <0>" and "key<1:0>." For example, one or two bits of the key can be provided to memory processor 710 as input. In addition, memory processor 710 can receive the address of a next child node via signal 712 and an address of a child node via signal 714.

As shown, the address of the child node can be provided to alignment block 716. Alignment block 716 can provide selected portions of the address of the child node to different ones of the inputs of each of multiplexers 718 and 720. For example, alignment block 716 can provide bits 10-12 of the address to a first input of multiplexer 718 and bits 9-11 of the address to a second input of multiplexer 718.

As discussed above, multiplexer 720 can receive slices of the key. For example, multiplexer 720 can have two inputs where each is configured to receive a concatenated value indicated in FIG. 7 using a comma. Each input of multiplexer 720, for example, can be configured to receive one or more upper bits of the address and one or more, e.g., two, bits that are slices of the key. For purposes of illustration, the implementation shown in FIG. 7 assumes that the key is sliced or processed into two or more different slices outside of each stage or BRAM 700. Accordingly, each stage can receive a portion of the key, e.g., one bit, two bits, or the like, after feeding the slices through a delay line as will be described herein in greater detail.

A stride select signal 750 can be provided to each of multiplexers 718 and 720. Stride select signal 750 can be a configurable part of memory processor 710 that can be specified by the loading of a configuration bitstream. Accordingly, depending upon stride select signal 750, multiplexer 720 can output either the first input or the second input. For example, multiplexer 720 can select the stride for the level in the trie. The stride indicates how many key bits are used in the current stage of the lookup operation being performed. As pictured in FIG. 7, the stride is either 1 or 2. For example, when the stride is 1, then one key bit is used in the stage or per stage. When the stride is 2, two key bits are used in the stage or per stage.

Multiplexor 728 can be configured to select between an address for the initial stage or a subsequent stage. In the initial stage, a larger, e.g., a full length, stride is used. In this example, the full length stride is 11 bits because RAM element 705 is implemented as a 36K RAM that is configured as 18 bits by 2048 entries. For all subsequent stages, a stride of either one or two bits can be used as output from multiplexer 728.

Also, based upon stride select signal 750, multiplexer 718 can output bits 10-12 of the address or bits 9-11 of the address extracted from signal 714. The output from multiplexer 718 can be provided to circuit block 746. Circuit block 746 can be configured to check for a predetermined number of bits having a predetermined value. As is the case with stride select signal 750, the particular number and value for the bits that are checked by circuit block 746 can be configurable through the loading of a configuration bitstream.

For example, in one aspect, circuit block 746 can be implemented as an AND gate that can compare one or more bit values that are determined or specified according to the loading of a configuration bitstream and denoted as signal 722 with the output of multiplexer 718. In accordance with the example pictured in FIG. 7, signal 722 can specify three bit values that can be compared with the signal output from multiplexer 718. It should be appreciated, however, that other circuit configurations can be implemented and that the use of an AND gate is for purposes of illustration only.

Multiplexer 724 can receive the output of circuit block 746 as a first input and a hardcoded value, e.g., a one value, as a second input. Multiplexer 724 can be configured to pass either the output from circuit block 746 or the hardcoded value according to an initial stage signal 752. Initial stage signal 752 can be part of a programmable configuration for the stage. As such, initial stage signal 752 can be set to indicate whether BRAM 700 is implementing the first stage of the lookup pipeline. Circuit block 726, e.g., an AND gate, can provide an enable signal 740 to the enable port of RAM element 705 when each of the valid signal 754 and the output from multiplexer 724 is true for a given clock cycle.

The next child address specified by signal 712' can be determined, at least in part, by update stage block 730. Multiplexer 732 can pass either signal 714 or the output from update stage block 730 according to control signal type 756. Update stage block 730 can be configured to decrement the skip distance by one. For example, update stage block 730 can be implemented to assume that the child pointer is a 2-D pointer. Control signal type 756 checks whether the type of the child is a 2-D pointer or a leaf. The control signal type 756, for example, can be passed as part of the child, e.g., one bit of the child. Since a leaf already contains the result, the leaf can be passed directly. The 2-D pointer requires processing by update stage block 730 as described, e.g., decrementing.

Multiplexer 732 can provide an output signal that is received by multiplexer 734 as a first input. Data, e.g., a context and/or result, read from the address provided to the address port of RAM element 705 can be output from the data port and provided to the second input of multiplexer 734. Multiplexer 734 can pass either the output from multiplexer 732 or the data read from RAM element 705 according to the control signal skip 758.

Control signal skip 758, for example, can be generated based upon two checks from the incoming child signal 714. The two checks can include, or indicate, the type and the skip distance. When the type of the incoming child is a 2-D pointer, a second check can be performed on which the skip distance equals zero. The assignment for control signal skip 758 can be determined according to whether (a) the type is a leaf or (b) the type is a 2-D pointer and the skip distance is not zero. If either of conditions (a) or (b) is true, control signal skip 758 is assigned true. When control signal skip 758 is assigned a true value, the value from multiplexor 732 is used, e.g., passed through multiplexer 734. Otherwise, control signal skip 758 is assigned false and the value from memory is used.

Alignment block 716 can left shift the address pointer for the child as received on signal 714 so that the address is appropriately aligned, depending on the configured stride. The incoming child can be either a 2-D pointer or a leaf. If a 2-D pointer, the skip distance can be checked for equality to zero. When the skip distance is not zero, the address of the child is decremented by update stage block 730 and the child is passed to the next stage. When the skip distance is zero, a new child can be read from memory by setting the bottom stride address bits to the address pointer from the child. The new child is passed to the next stage as signal 714'.

Multiplexer 734 can provide an output to multiplexer 736. As shown, multiplexer 736 can receive the output from multiplexer 734 as a first input and signal 712 as a second input. Accordingly, multiplexer 736 can pass either the output from multiplexer 734 or signal 712 according to enable signal 740 as signal 712'. The output generated by multiplexer 736 can be output from memory processor 710 as signal 712'. Thus, when BRAM 700 is enabled for the current clock cycle, memory processor 710 reads from memory and modifies the address for the next child as specified and output on signal 712'.

Signal 712' can be provided to multiplexer 738 as a first input. Signal 714 specifying the address of the child can be provided to multiplexer 738 as a second input. Multiplexer 738 can pass signal 712' or signal 714 as signal 714' according to control signal 742. Control signal 742 indicates whether BRAM 700 is a "stage edge." More particularly, control signal 742 can indicate whether BRAM 700 is the last BRAM of a stage of the pipelined structure. As such, control signal 742 also can be a configurable signal that can be specified through the loading of a configuration bitstream. In any case, when BRAM 700 is the last BRAM of a stage, multiplexer 738, based upon control signal 742, effectively assigns the address of the next child, as specified on signal 712', to the address for the child for the next stage on signal 714'.

Figure 8:
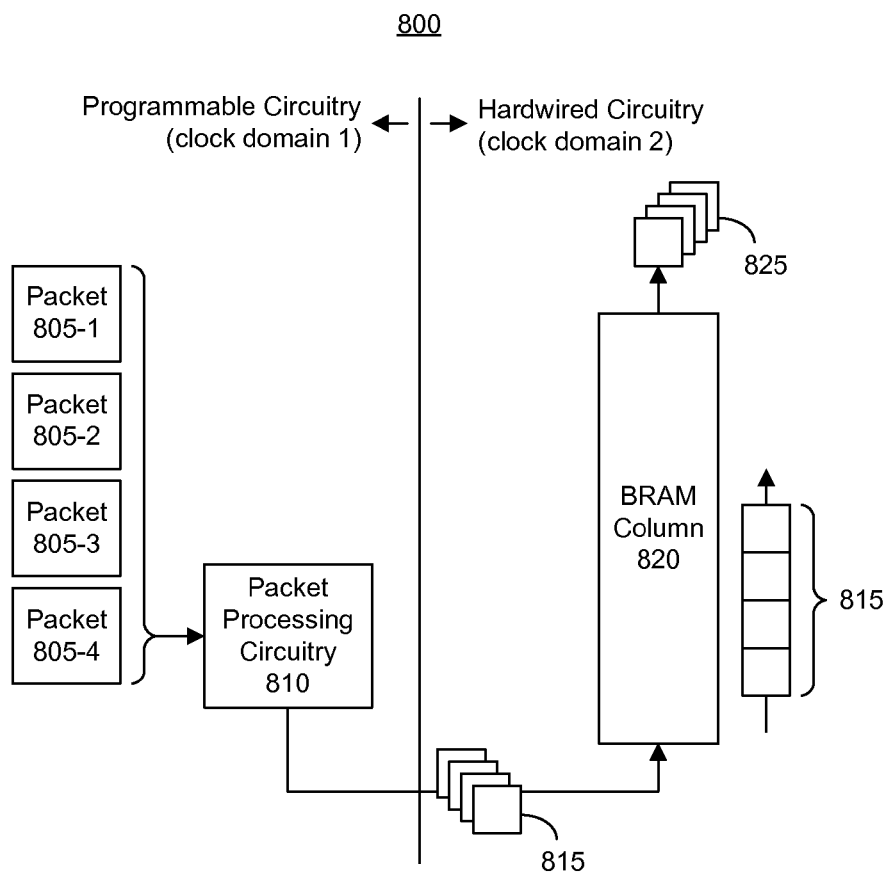
FIG. 8 is a block diagram illustrating a multi-stage pipelined structure within an IC in accordance with another embodiment disclosed within this specification.

FIG. 8 is a block diagram illustrating a multi-stage pipelined structure 800 within an IC in accordance with another embodiment disclosed within this specification. FIG. 8 illustrates an example that can be used with a BST type of table implementation. As shown, packet processing circuitry 810 can be implemented within a programmable circuitry portion of an IC. Packet processing circuitry 810 can operate in a first clock domain having a first clock frequency. In general, packet processing circuitry 810 can extract keys from each of the received packets 805-1, 805-2, 805-3, and 805-4.

BRAM column 820, as discussed, can include hardwired data paths that are implemented to couple the various memory processors within each of the BRAMs communicatively linked within BRAM column 820. BRAM column 820 can operate in a second clock domain having a second frequency that is different, e.g., higher, than the first clock frequency of clock domain 1. In one example, the second clock frequency can be a multiple of the first clock frequency. In the example pictured in FIG. 8, the second clock frequency can be four times that of the first clock frequency.

Accordingly, packets can arrive on a network interface within the programmable circuitry, e.g., within packet processing circuitry 810. Header information, e.g., keys, can be extracted by packet processing circuitry 810 and provided to BRAM column 820. With clock frequency 2 being four times faster than clock frequency 1, four keys can be provided to BRAM column 820. Thus, depending upon the multiple of clock frequency 2 relative to clock frequency 1, multiple keys can be grouped together and provided to BRAM column 820 for processing in parallel.

In illustration, each key extracted from a packet 805 can be 128 bits. Packet processing circuitry 810 can provide four keys to BRAM column 820 in parallel, thereby requiring 512 bit lines. When received by BRAM column 820, due to the speed increase, keys 815 can be serialized to propagate through the multi-stage pipeline architecture serially as shown. The four keys 815 can be passed into BRAM column 820 in four consecutive hardware cycles and propagate along the hardwired data path along with valid indication bits indicating when a particular BRAM receives a key, or portion thereof, upon which to operate. In this example, due to the key width, the data path can be 128 bits plus an additional bit for the valid signal, e.g., 129 bits in total. Due to the increase in speed of BRAM column 820, a result 825 of processing the four keys 815 from packets 805 can be output. Result 825 can be provided to the programmable circuitry of the IC in parallel. Result 825 actually includes four 17-bit results, e.g., one 17-bit result for each packet or key, in parallel, which can be output from the last stage of BRAM column 820.

Figure 9:
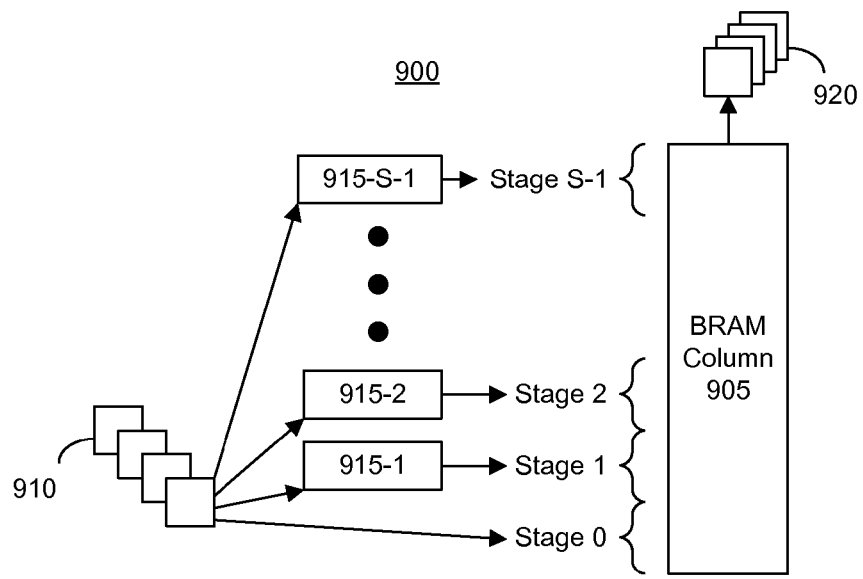
FIG. 9 is a block diagram illustrating a multi-stage pipelined structure within an IC in accordance with another embodiment disclosed within this specification.

FIG. 9 is a block diagram illustrating a multi-stage pipelined structure 900 within an IC in accordance with another embodiment disclosed within this specification. FIG. 9 illustrates an example that can be used with a trie type of table implementation. For ease of illustration, packet processing circuitry is not illustrated, though packets can be processed as described with reference to FIG. 8 with keys, or portions thereof, being extracted and provided to the circuitry illustrated in FIG. 9.

As shown, BRAM column 905 can include "S" stages, where S is an integer, and the key can have a width of the initial stride+S−1 bits. Four consecutive packet keys can be extracted and provided in parallel to BRAM column 905. The initial stride bits of four keys can be provided to stage 0 in parallel. In this example, stage 0 can receive four 11-bit initial strides, e.g., 44-bits. The remaining key bits can be fed to delay lines 915-1, 915-2 through 915-S and then to stages 1 through S−1 so that each key arrives at the appropriate stage when the corresponding context reaches that stage.

The length of the delay can be "X" cycles for stage X, e.g., one cycle for stage 1, two cycles for stage 2, etc. A result 920 of BRAM column 905 can include four results in parallel at stage S−1. Each individual result can be 18-bits. Accordingly, result 920 can 4×18-bits. An alternative implementation can deliver all key bits to all of the stages using a hardened data path that can be implemented within one or more metal layers above each of the BRAMs forming BRAM column 905.

Figure 10:
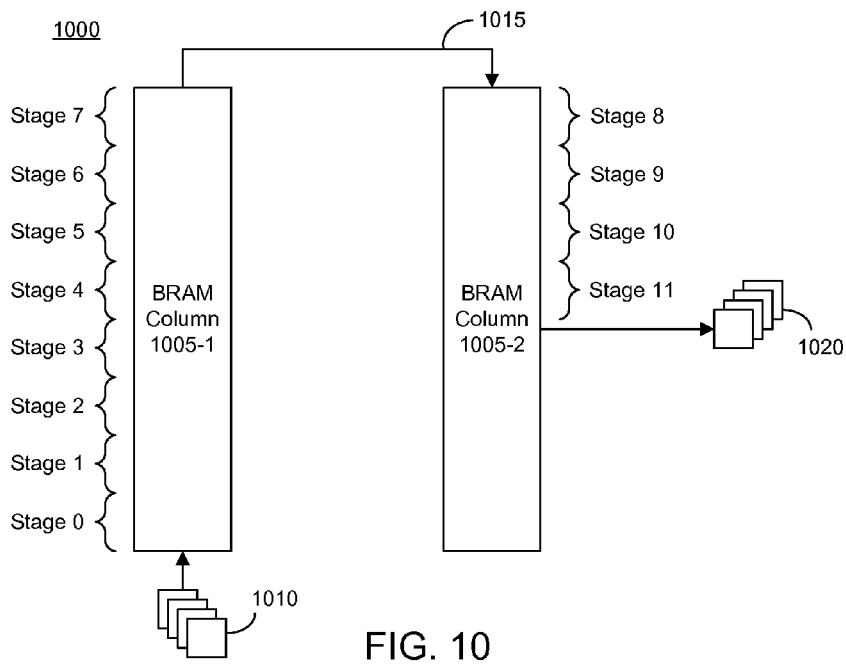
FIG. 10 is a block diagram illustrating a multi-stage pipelined structure in accordance with another embodiment disclosed within this specification.

FIG. 10 is a block diagram illustrating a multi-stage pipelined structure 1000 in accordance with another embodiment disclosed within this specification. FIG. 10 illustrates a case in which two different BRAM columns 1005-1 and 1005-2 within an IC are coupled together in serial to implement a larger structure for use with a BST type of table implementation. In the example shown, stages 0-7 are mapped to BRAM column 1005-1. Stages 8-11 are mapped to BRAM column 1005-2.

As discussed, a plurality of keys 1010 can be provided in parallel from slower circuitry to the higher speed BRAM columns 1005. Signal 1015 can couple BRAM column 1005-1 with BRAM column 1010-2. Continuing with the prior example in which each key is 128 bits and the result for each key or packet is 17-bits, signal 1015 can be a 580-bit signal path to propagate four keys (4×128) and four results (4×17) from BRAM column 1005-1 to BRAM column 1005-2. Results 1020, including four individual results, can be collected and output from stage 11. Results 1020 can be output as described with reference to FIG. 8, e.g., as four individual 17-bit results that can be provided in parallel to other circuitry such as programmable circuitry of the IC.

Figure 11:
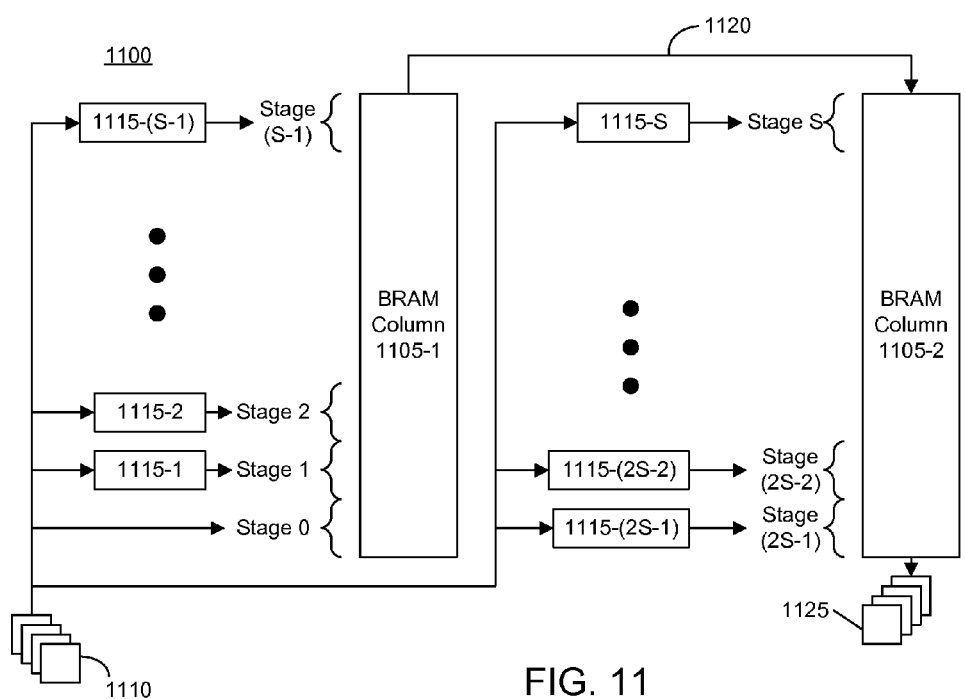
FIG. 11 is a block diagram illustrating a multi-stage pipelined structure in accordance with another embodiment disclosed within this specification.

FIG. 11 is a block diagram illustrating a multi-stage pipelined structure 1100 in accordance with another embodiment disclosed within this specification. FIG. 11 illustrates a case in which two different BRAM columns 1105-1 and 1105-2 within an IC are coupled together in serial to implement a larger structure for use with a trie type of table implementation. In the example shown, stage 0 through stage (S−1) are mapped to BRAM column 1105-1. Stage S through stage (2S−1) are mapped to BRAM column 1105-2.

The initial stride bits of four keys 1110 can be provided to stage 0 in parallel. In this example, stage 0 can receive four 11-bit initial strides, e.g., 44-bits. The remaining key bits can be fed to delay lines 1115-1 through 1115-(2S−1) and then to stages 1 through 2S−1 respectively so that each key arrives at the appropriate stage when the corresponding context reaches that stage. Appreciably, each of delays 1115-1 through 1115-(2S−1) provides an increasing amount of delay, e.g., one additional clock cycle of delay. Signal 1120 can provide four results, e.g., 4×18-bit results or 72 bits, as determined by BRAM column 1105-1 to BRAM column 1105-2. A result 1125 of BRAM column 1105-2 can include four results which can be formatted in parallel after being output from stage 2S−1. Each individual result can be 18-bits. Accordingly, result 1125 can be 4×18-bits. An alternative implementation can deliver all key bits to all of the stages using a hardened data path that can be implemented within one or more metal layers above each of the BRAMs forming BRAM column 1105-1 and BRAM column 1105-1.

Figure 12:
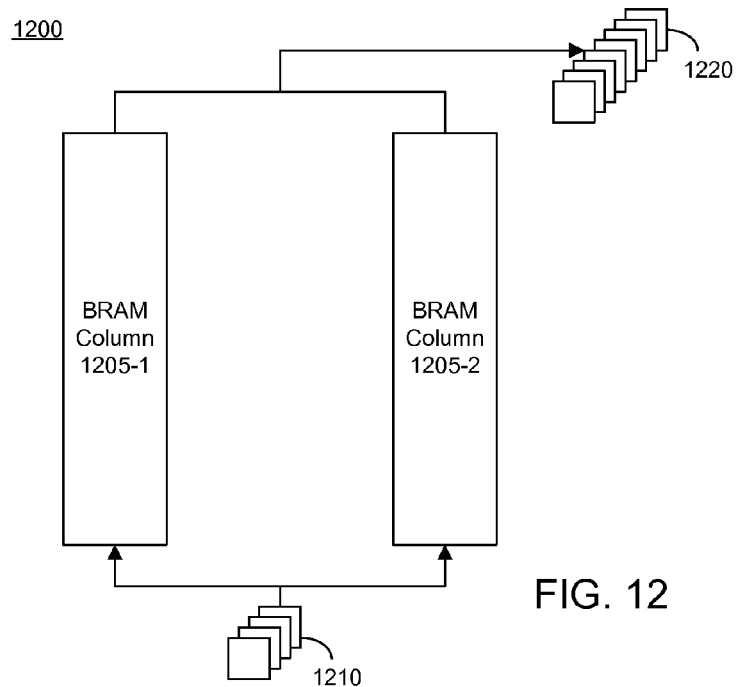
FIG. 12 is a block diagram illustrating a multi-stage pipelined structure in accordance with another embodiment disclosed within this specification.

FIG. 12 is a block diagram illustrating a multi-stage pipelined structure 1200 in accordance with another embodiment disclosed within this specification. FIG. 12 illustrates an implementation for use with BST types of tables in which two different BRAM columns 1205-1 and 1205-2 within an IC are operated in parallel with the results being merged. Multi-stage pipelined structure 1200 can implement a larger table as is the case with FIG. 10, but with lower latency. The table to be implemented can be partitioned and mapped into two separate tables that are mapped onto BRAM columns 1205-1 and 1205-2 respectively. The latency is less because the resulting structure has fewer stages than an implementation of the original table using BRAM columns coupled in serial.

As shown, keys 1210, e.g., the same four keys, as extracted from four received packets, can be provided to each of BRAM columns 1205-1 and 1205-2 as shown. The result determined by each of BRAM columns 1205-1 and 1205-2 can be merged and output as result 1220. Result 1220 can be determined, for example, by either selecting the LPM or returning that there was no match.

Figure 13:
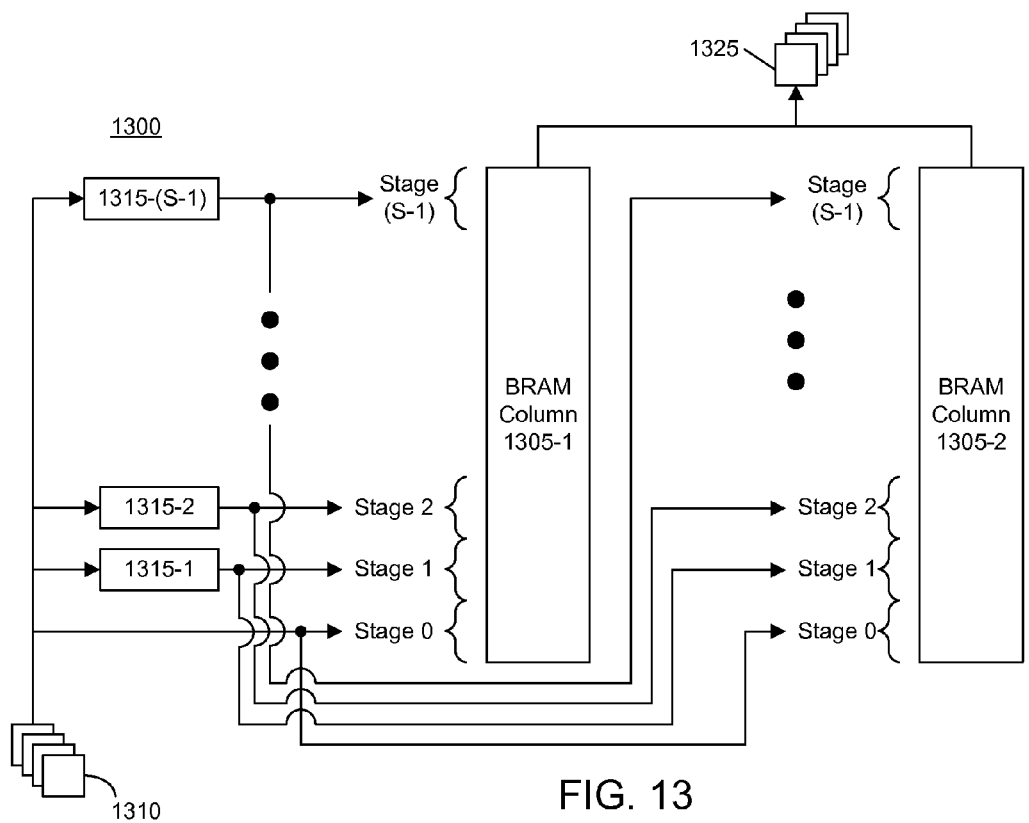
FIG. 13 is a block diagram illustrating a multi-stage pipelined structure in accordance with another embodiment disclosed within this specification.

FIG. 13 is a block diagram illustrating a multi-stage pipelined structure 1300 in accordance with another embodiment disclosed within this specification. FIG. 13 illustrates a case in which two different BRAM columns 1305-1 and 1305-2 within an IC each implement multi-stage pipelined structures for trie type table implementations and are coupled in parallel. In the example shown, stage 0 through stage (S−1) are mapped to BRAM column 1305-1 and to BRAM column 1305-2.

The initial stride bits of four keys 1310 can be provided to each stage 0 in parallel. In this example, stage 0 can receive four 11-bit initial strides, e.g., 44-bits. The remaining key bits can be fed to delay lines 1315-1 through 1315-(S−1) and then to stages 1 through S−1 respectively within each of BRAM columns 1305-1 and 1305-2 so that each key arrives at the appropriate stage when the corresponding context reaches that stage. While serial configurations require a delay line for each stage, as shown in FIG. 13, one delay line can provide data to each of two parallel stages, e.g., a same stage in each of BRAM columns 1305-1 and 1305-2. A merged result 1325 from each of BRAM columns 1305-1 and 1305-2 can be output from each of stages S−1. The result of multiple pipelines can be merged by comparing the outputs from all pipelines and either selecting the LPM or returning that there was no match as a result. Each individual result can be 18-bits. Accordingly, result 1325 can be 4×18-bits.

Figure 14:
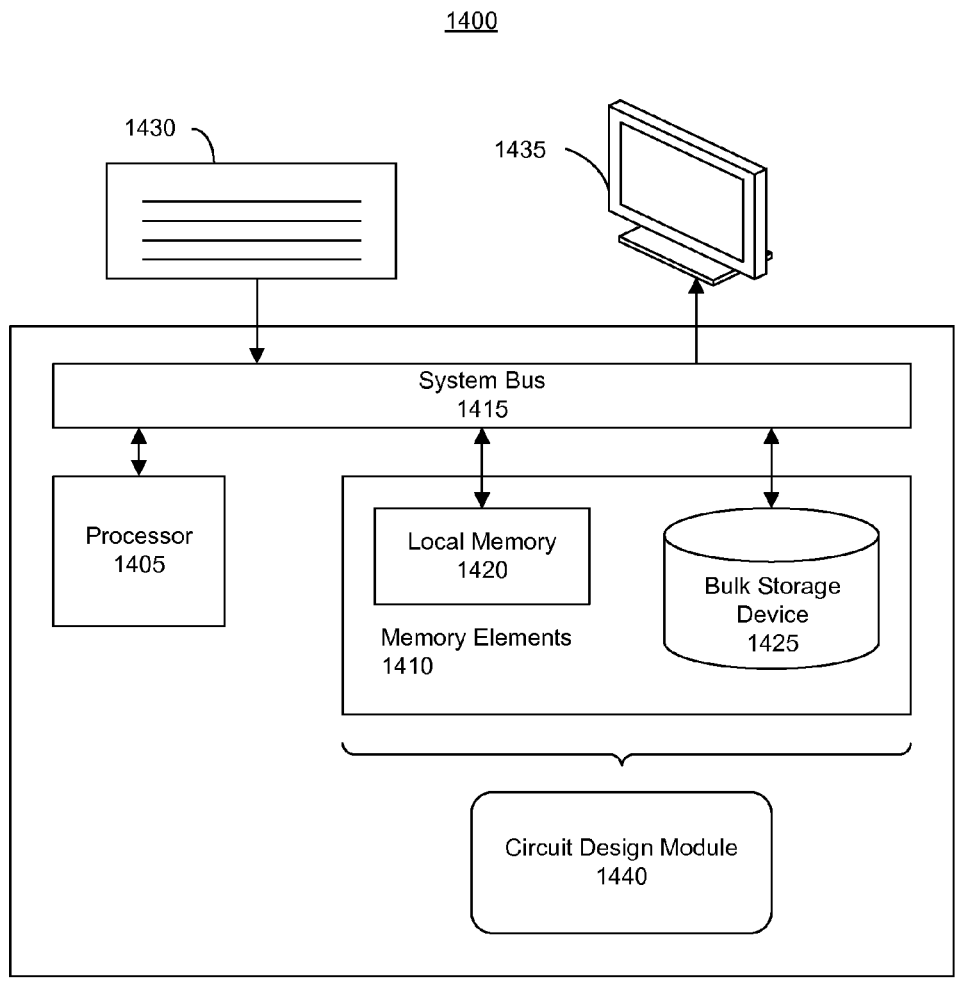
FIG. 14 is a block diagram illustrating a system for generating circuit designs in accordance with another embodiment disclosed within this specification.

FIG. 14 is a block diagram illustrating a system 1400 for generating circuit designs in accordance with another embodiment disclosed within this specification. System 1400 can include at least one processor 1405 coupled to memory elements 1410 through a system bus 1415. As such, system 1400 can store program code within memory elements 1410. Processor 1405 can execute the program code accessed from memory elements 1410 via system bus 1415. In one aspect, for example, system 1400 can be implemented as a computer that is suitable for storing and/or executing program code. It should be appreciated, however, that system 1400 can be implemented in the form of any system including a processor and memory that is capable of performing the functions described within this specification.

Memory elements 1410 can include one or more physical memory devices such as, for example, local memory 1420 and one or more bulk storage devices 1425. Local memory 1420 refers to random access memory or other non-persistent memory device(s) generally used during actual execution of the program code. Bulk storage device(s) 1425 can be implemented as a hard drive or other persistent data storage device. System 1400 also can include one or more cache memories (not shown) that provide temporary storage of at least some program code in order to reduce the number of times program code must be retrieved from bulk storage device 1425 during execution.

Input/output (I/O) devices such as a keyboard 1430, a display 1435, and a pointing device (not shown) optionally can be coupled to system 1400. The I/O devices can be coupled to system 1400 either directly or through intervening I/O controllers. Network adapters also can be coupled to system 1400 to enable system 1400 to become coupled to other systems, computer systems, remote printers, and/or remote storage devices through intervening private or public networks. Modems, cable modems, and Ethernet cards are examples of different types of network adapters that can be used with system 1400.

As pictured in FIG. 14, memory elements 1410 can store a circuit design module 1440. Circuit design module 1440, being implemented in the form of executable program code, can be executed by system 1400. Circuit design 1440 can generate one or more circuit designs for instantiation within, or implementation as, an IC. The circuit designs that are generated can be instantiated within an IC, whether the IC is a programmable IC or not. Further, the circuit designs can be specified in programmatic form as a netlist, one or more hardware description language files, or as a configuration bitstream. The circuit design generated using system 1400 can include or specify configuration data suitable for configuring the various multi-stage pipelined structures disclosed within this specification. For example, the circuit design can specify parameters needed to configure the RAM elements and the memory processors when arranged in a pipeline architecture as described herein.

In one aspect, circuit design module 1440 can be configured to perform functions such as standard synthesis, place and route, and the like to generate a circuit design. Circuit design module 1440 further can generate appropriate data structure implementations, given table entries and various user parameters, to load into the multi-stage pipelined structure that is specified.

Figure 15:
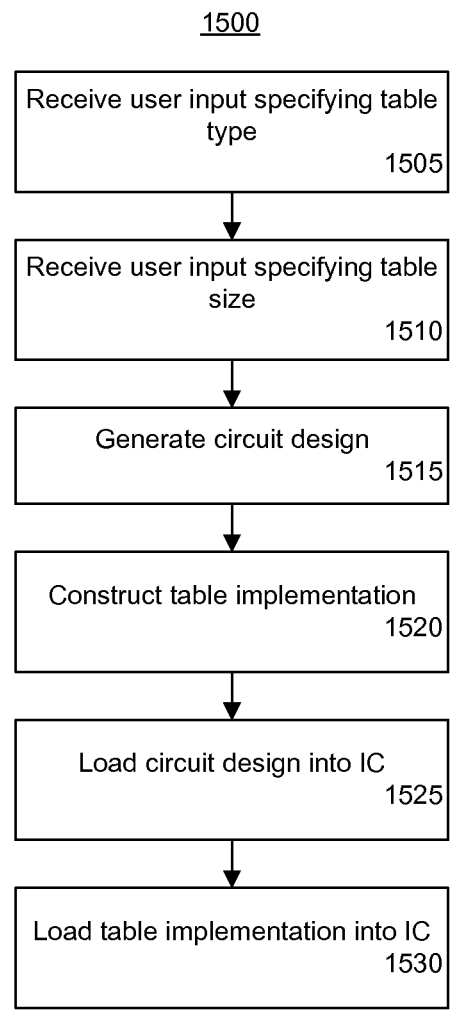
FIG. 15 is a flow chart illustrating a method of circuit design according to another embodiment disclosed within this specification.

FIG. 15 is a flow chart illustrating a method 1500 of circuit design according to another embodiment disclosed within this specification. FIG. 15 can be implemented by a system such as system 1400 described with reference to FIG. 13.

In block 1505, the system can receive user input specifying a type of table implementation. In one aspect, for example, a user input indicating whether the table is to be a BST or a trie implementation can be received. In the case of a BST implementation, the user input further can indicate whether the BST implementation is a BCAM or a TCAM implementation.

In block 1510, the system can receive a user input specifying table size information. For example, user input specifying width and height of the table can be received by the system. In block 1515, the system can generate a circuit design, e.g., a programmatic circuit design, that can be output. The resulting circuit design can specify or include a multi-stage pipelined structure conforming to the received user specified parameters. For example, the parameters received by the system from a user can be transformed to generate the appropriate settings for one or more BRAMs, as the case may be, and included within the resulting circuit design, which also can include various sub-circuits to be implemented within programmable circuitry of an IC.

In block 1520, the system further can construct a table implementation, e.g., a BST or a trie, that is populated with table entries either provided by or identified by the user to the system. In the case of a trie implementation, for example, the table that is populated can include prefixes at leaves. The resulting table implementation can map onto the multi-stage pipeline architecture generated in block 1515. It should be appreciated that the mapping algorithm can generate a balanced number of nodes per level.

In one or more embodiments, the table implementation and mapping can be performed in accordance with various techniques including, but not limited to, those described within Le et al., "Scalable High-Throughput SRAM-Based Architecture for IP-Lookup Using FPGA," Field Programmable Logic and Applications (2008) and Jiang et al., "A Memory-Balanced Linear Pipeline Architecture for Trie-Based IP Lookup," High-Performance Interconnects (2007), each of which is incorporated herein by reference in its entirety.

In block 1525, the circuit design generated by the system can be loaded into an IC. In block 1530, the system can load the table implementation generated in block 1520 into the multi-stage pipelined structure specified by the circuit design and now implemented with the IC.

The flowchart in the figures illustrates the architecture, functionality, and operation of possible implementations of systems, methods and computer program products according to one or more embodiments disclosed within this specification. In this regard, each block in the flowchart can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system including memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit comprising:
a programmable circuitry operable according to a first clock frequency and configured by loading configuration data to extract search keys from packets;
a first block random access memory comprising:
a first random access memory (RAM) element having a first data port; and
a first memory processor coupled to the first data port of the RAM element through a hardwired connection and coupled to the programmable circuitry;
wherein the first memory processor is operable according to a second clock frequency that is higher than the first clock frequency; and
wherein the first memory processor is hardwired and performs operations solely in the first RAM element;
a second block random access memory comprising:
a second RAM element having a second data port; and
a second memory processor coupled to the second data port of the second RAM element through a hardwired connection and serially connected to the first memory processor through a hardwired connection;
wherein the second memory processor and the data port of the second RAM element operate at the second clock frequency; and
wherein the second memory processor performs operations solely in the second RAM element;
wherein each of the first memory processor and the second memory processor is operable to perform a comparison operation using data read from the first RAM element and the second RAM element respectively;
wherein the hardwired connection between the first memory processor and the second memory processor passes data read from the first RAM element from the first memory processor to the second memory processor;
wherein each of the first block RAM and the second block RAM operate upon a portion of a search key obtained from the programmable circuitry; and
wherein each hardwired connection is functional within the integrated circuit without loading the configuration data.

2. The integrated circuit of claim 1, wherein:
each RAM element further comprises a data port that is coupled to the programmable circuitry; and
only the data port coupled to the programmable circuitry or the data port hardwired to the dedicated memory processor is operable at one time.

3. The integrated circuit of claim 1, wherein the first memory processor operates upon a first slice of the search key and the second memory processor operates upon a second slice of the same search key.

4. The integrated circuit of claim 3, wherein each memory processor comprises a most-significant cell configured to indicate whether the block random access memory, when coupled to at least one additional block random access memory, is designated for checking a most-significant bit of the at least a portion of the search key.

5. The integrated circuit of claim 3, wherein each memory processor comprises a least-significant cell configured to indicate whether the block random access memory, when coupled to at least one additional block random access memory, is designated for checking a least-significant bit of the at least a portion of the search key.

6. The integrated circuit of claim 1, wherein:
each memory processor is configured to perform search operations for a portion of a table stored within the RAM element as binary search tree formatted data; and
each memory processor comprises a multi-bit comparator block coupled to the first data port.

7. The integrated circuit of claim 6, wherein each RAM element is configured as a Binary Content Addressable Memory and each memory processor is configured in a Binary Content Addressable Memory operating state.

8. The integrated circuit of claim 6, wherein each RAM element is configured as a Ternary Content Addressable Memory and each memory processor is configured in a Ternary Content Addressable Memory operating state.

9. The integrated circuit of claim 1, wherein each memory processor is configured to perform search operations for a portion of a table stored within the RAM element as trie formatted data.

10. An integrated circuit comprising: a programmable circuitry operable by loading configuration data causing the programmable circuitry to extract search keys from packets; and a multi-stage pipeline circuit structure comprising: a plurality of block random access memories; wherein each block random access memory comprises a random access memory element having at least one data port and a dedicated memory processor coupled to the data port, wherein each memory processor is hardwired and performs operations solely in the random access memory element to which the memory processor is dedicated; wherein each memory processor of the plurality of block random access memories is coupled to at least one other memory processor of another block random access memory of the plurality of block random access memories through a hardwired signal path; wherein at least one memory processor of the plurality of block random access memories is coupled to the programmable circuitry and is configured to receive at least a portion of a search key; wherein each hardwired memory processor and each hardwired signal path coupling memory processors is functional within the integrated circuit without loading the configuration data; wherein each memory processor is operable to perform a comparison operation using data read from the block random access memory dedicated to the memory processor; and wherein the hardwired connections between the memory processors pass data read from the block random access memories; wherein the programmable circuitry is operable at a first clock frequency; and wherein each memory processor of the plurality of block random access memories is operable at a second clock frequency that is higher than the first clock frequency.

11. The integrated circuit of claim 10, wherein:
a first group of the plurality of block random access memories is configured as a first stage of a multi-stage pipelined structure; and
a second group of the plurality of block random access memories is configured as a second stage of the multi-stage pipelined structure.

12. The integrated circuit of claim 10, wherein at least one memory processor of each stage comprises:
a most-significant cell configured to indicate whether the block random access memory to which the memory processor belongs, when coupled to at least one additional block random access memory of a group, is designated for checking a most-significant bit of the at least a portion of the search key.

13. The integrated circuit of claim 10, wherein at least one memory processor of each stage comprises:
a least-significant cell configured to indicate whether the block random access memory, when coupled to at least one additional block random access memory of a group, is designated for checking a least-significant bit of the at least a portion of the search key.

14. The integrated circuit of claim 10, wherein the programmable circuitry is configured to extract key data from at least two packets and provide the key data in parallel to the multi-stage pipeline circuit structure.

15. The integrated circuit of claim 14, wherein a first portion of key data is provided to a first stage of the multi-stage pipeline circuit structure; and
wherein each portion of the key data other than the first portion is provided to a delay line and output from the delay line to a stage of the multi-stage pipeline circuit structure other than the first stage.

16. The integrated circuit of claim 10, wherein the multi-stage pipeline circuit structure comprises:
a first column comprising a first subset of the plurality of block random access memories coupled in series; and
a second column comprising a second subset of the plurality of block random access memories coupled in series;
wherein the first column is coupled in series with the second column.

17. The integrated circuit of claim 10, wherein the multi-stage pipeline circuit structure comprises:
a first column comprising a first subset of the plurality of block random access memories coupled in series; and
a second column comprising a second subset of the plurality of block random access memories coupled in series;
wherein the first column and the second column are coupled in parallel and each receives same key data.

18. The integrated circuit of claim 10, wherein each random access memory element comprises:
a first data port that is coupled to the dedicated memory processor for the random access memory element through a hardwired connection; and
a second data port that is coupled to the programmable circuitry through a programmable connection; and
wherein either the first data port or the second data port is operable at one time.

* * * * *